US 6,681,103 B1

(12) United States Patent
Rogers et al.

(10) Patent No.: US 6,681,103 B1
(45) Date of Patent: Jan. 20, 2004

(54) ON-CHIP IMAGE REJECT FILTER

(75) Inventors: John William Mitchell Rogers, Ottawa (CA); Calvin Plett, Ottawa (CA)

(73) Assignee: Sige Semiconductor Inc., Ottawa (CA)

( * ) Notice: Subject to any disclaimer, the term of this patent is extended or adjusted under 35 U.S.C. 154(b) by 552 days.

(21) Appl. No.: 09/645,323

(22) Filed: Aug. 25, 2000

(51) Int. Cl.$^7$ ................................................ H04B 1/10
(52) U.S. Cl. ...................... 455/302; 455/285; 455/290; 455/307; 455/333
(58) Field of Search ................................ 455/302, 307, 455/339, 340, 333, 191.2, 193.2, 193.3, 197.2, 197.3, 285, 287, 290, 291, 292, 293, 341, 342; 330/61 R, 61 A, 99, 100, 151, 310, 311

(56) References Cited

U.S. PATENT DOCUMENTS

| | | | | |
|---|---|---|---|---|
| 3,993,962 A | * | 11/1976 | Hopwood et al. | 331/18 |
| 4,263,676 A | | 4/1981 | Liebel | 455/285 |
| 5,374,899 A | | 12/1994 | Griffiths et al. | 330/277 |
| 6,081,168 A | * | 6/2000 | Park | 331/179 |
| 6,175,274 B1 | * | 1/2001 | Groe | 330/51 |
| 6,177,964 B1 | * | 1/2001 | Birleson et al. | 348/725 |
| 6,307,442 B1 | * | 10/2001 | Meyer et al. | 331/17.1 |
| 6,542,724 B1 | * | 4/2003 | Copeland et al. | 455/302 |

FOREIGN PATENT DOCUMENTS

| | | | |
|---|---|---|---|
| DE | 19851718 | 11/1999 | |
| EP | 0831584 | 9/1997 | ............. H03F/1/32 |
| EP | 0886384 | 6/1998 | ............. H04B/1/26 |
| EP | 0911969 | 10/1998 | ............. H03F/3/72 |

OTHER PUBLICATIONS

Jose A. Macedo, et al. "A 1.9–GHz Silicon Receiver with Monotithic Image Filtering", IEEE Journal of Solid–State Circuits, Col. 33, No. 3, Mar. 1998 pp 378–386.

* cited by examiner

Primary Examiner—Duc M. Nguyen

(57) ABSTRACT

With the rising popularity in wireless personal communication systems (PCS), there is a need for low-power, low-cost radio receivers. Low cost can be achieved by integrating the required functions as much as possible, thus minimizing the number of off-chip components. The present invention discloses a novel topology for integrating an image reject filter with a traditional low-noise amplifier (LNA) for use in the front-end of a superheterodyne receiver. Previous topologies employing additional filter stages after the LNA have suffered from poor performance and excessive current consumption. Advantageously, the topology of the present invention requires minimal additional circuitry to perform the filtering function, uses only minimal additional current and does not suffer from the same performance limitations as previous topologies.

13 Claims, 2 Drawing Sheets

ON-CHIP IMAGE REJECT FILTER

FIELD OF THE INVENTION

This invention relates to noise suppression in communications systems and, more particularly, to the suppression of image noise in superheterodyne communications receivers using an on-chip image rejection filter.

BACKGROUND OF THE INVENTION

Superheterodyne receivers continue to be used as the basic architectural element in mobile communications systems. A superheterodyne receiver front-end typically consists of a low-noise amplifier (LNA), an image reject filter, a mixer, and a VCO as shown in FIG. 1. An LNA with very low noise figure is typically required to enable the receiver to detect very weak signals. Additionally, the LNA must provide sufficient gain to suppress the noise generated by the stages that follow it. The mixer allows for downconversion or the translation of the desired signal from the radio frequency (RF) to an intermediate frequency (IF) for further processing by the receiver backend.

A well-known occurrence in superheterodyne receivers is that the front-end low-noise amplifier (LNA) may generate thermal noise at an image frequency (located a distance of two IFs away from the desired radio frequency, and that during downconversion, the image noise will fold over onto the thermal noise at the desired receiver frequency. In a more likely scenario, however, some other signal broadcasted at the image frequency may be received by the antenna and amplified by the LNA along with the desired signal. In any case, some form of image noise rejection is required prior to downconversion to suppress the unwanted image signals.

Currently, "off-chip" passive filters, such as surface acoustic wave (SAW) filters or ceramic filters are often used for image rejection. These filters, however, represent a major impediment to raising the level of integration of wireless radios, since they cannot be easily integrated with the silicon (Si) substrate. Furthermore, their use complicates the design of the receiver front-end. For example, the LNA must be designed to drive 50 ohms as its output comes off-chip. Matching from the LNA to the filter must, therefore, be performed either on-chip or on the board. The filter must then be matched to the mixer input, which must also be driven by 50 ohms. This implies that large radio frequency (RF) signals will be present on two bond wires in the package used for the receiver. And since bond wires are a major source of signal coupling, this leads to increased signal coupling between respective ports in the receiver. Furthermore, additional pins must be included to accommodate the off-chip filter leading to more expensive packages and, often, a larger integrated circuit (IC) die.

Off-chip filters also represent a significant fraction of the overall cost of the receiver front-end. However, if effort is expended to integrate the filter monolithically, then the signal will never have to leave the chip before reaching the IF stage in the receiver chain. In this way, a simpler cheaper package may be used and the costly off-chip filter can be eliminated.

To date, monolithic image rejection has only been demonstrated satisfactorily using image reject mixers. However, such implementations have not provided the level of rejection required to meet the specifications of existing cellular standards. A monolithic image reject filter integrated between the LNA and the mixer continues, therefore, to be a challenge for the RF design community.

An obvious approach to the realization of a monolithic image reject filter is to use a bandpass filter to pass the desired signal and not the image. However, a monolithic bandpass filter suitable in performance for a receiver front-end has not yet been demonstrated. Low-power tunable monolithic bandpass filters with high selectivity are difficult to realize, due to stability, linearity and noise considerations.

Recently, a few "on-chip" notch filter implementations of image reject filters have been reported. However, the majority of these suffer from poor linearity and poor noise figure (i.e. they become limiting factors in the quality of the information being received). Most of these implementations also require a great deal of extra circuitry and chip area, not to mention current.

As the popularity in wireless personal communication systems (PCS) continues to grow, the need for low-power, low-cost radio receivers is paramount. Low-cost can be achieved by integrating the required functions as much as possible, and minimizing the number of off-chip components.

SUMMARY OF THE INVENTION

Previous on-chip solutions for integrating the image rejection filter on a receiver front-end have employed an additional stage following the low-noise amplifier (LNA) to perform the image rejection function for the receiver. The present invention, however, discloses a novel topology for integrating an image reject filter with a traditional LNA for use in the front-end of a superheterodyne receiver.

According to a first broad aspect of the invention, the conventional topology for an LNA is modified by replacing the degeneration inductor with a resonator to provide a notching action in the frequency response of the LNA at the unwanted image frequency component. The LC resonator is centered at the image frequency and presents a high impedance to the emitter of the driving amplifier so as to cause the driving amplifier to have a substantially low gain at the image frequency.

According to a second broad aspect of the invention, a multi-terminal circuit element having a first conducting terminal for providing an output signal, a second conducting terminal connected to an inductive degeneration element and a control terminal for receiving an input signal is AC coupled via its second conducting terminal to a filtering network. The filtering network is adjusted to provide a substantially high impedance to the second conducting terminal of the multi-terminal circuit element at the image frequency of the input signal so as to cause an unwanted image frequency component to be substantially eliminated in the output signal of the multi-terminal circuit element.

The topology of the present invention requires minimal additional circuitry to perform the filtering function, uses only minimal additional current and does not suffer from the same performance limitations as currently used topologies.

Other aspects and features of the present invention will become apparent to those ordinarily skilled in the art upon review of the following description of specific embodiments of the invention in conjunction with the accompanying drawings.

DESCRIPTION OF THE PREFERRED EMBODIMENTS

Figure 1:
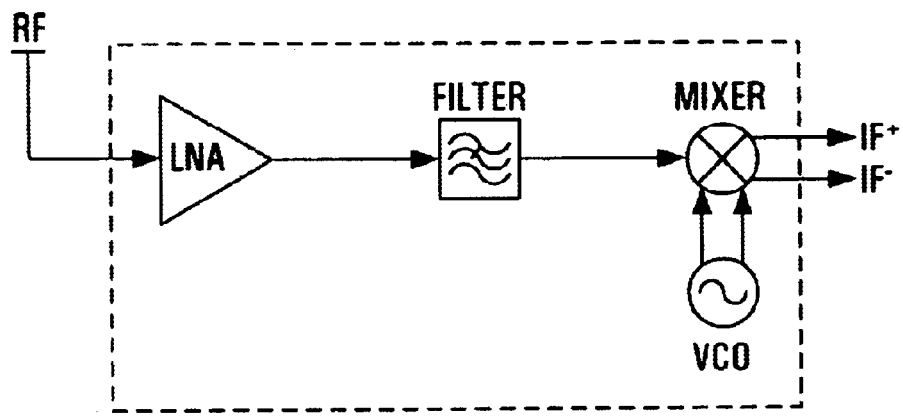
FIG. 1 is a block diagram of the front-end of a superheterodyne receiver.
Figure 2:
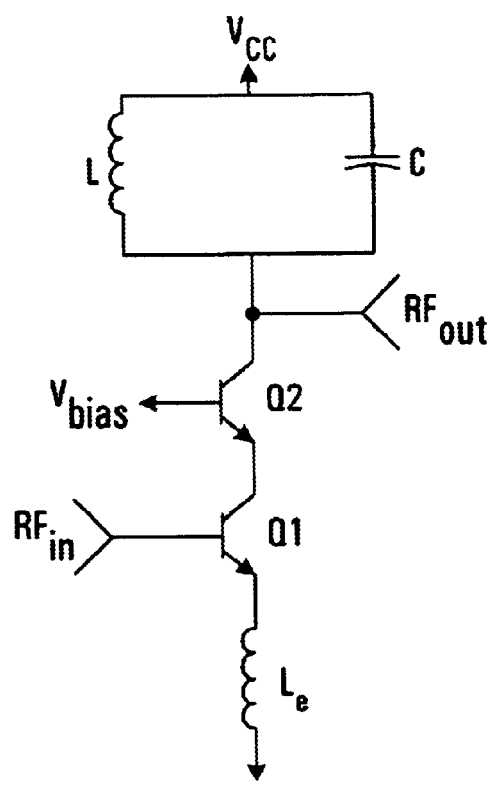
FIG. 2 illustrates a conventional cascode low-noise amplifier (LNA).

The conventional topology for a low-noise amplifier (LNA) commonly used in superheterodyne receivers is shown in FIG. 2. This two-stage amplifier comprises an npn transistor Q1 arranged as a common-emitter (CE) amplifier, driving a cascode npn transistor Q2. The LNA further comprises an inductor L and a capacitor C arranged to form an LC resonant tank at the collector of cascode transistor Q2. The emitter of the transistor Q1 is grounded through an emitter degeneration inductor $L_e$. Note that all biasing details for this circuit are well known to those skilled in the art and have, as such, been omitted. The topology of FIG. 2 is usually selected for the LNA in a communications receiver in order that noise figure be minimized while still obtaining good gain.

In the conventional topology shown in FIG. 2, the cascode transistor Q2 acts to improve stability, frequency response and reverse isolation in the circuit. The inductor L and capacitor C set the center frequency of the amplification stage i.e. the frequency at which the gain of the amplifier is highest. Finally, the degeneration inductor $L_e$ aids in improving the matching of the circuit at the input and also improves linearity at the cost of some gain.

In terms of operation, an RF input voltage $RF_{in}$ applied to the base of the driving amplifier transistor Q1 is transformed into a current that is passed through the cascode transistor Q2 to provide an output voltage $RF_{out}$. In practice, however, the output $RF_{out}$ of the LNA is usually fed to an off-chip image reject filter to suppress the unwanted image frequency. This approach has significant disadvantages for the reasons stated earlier.

Figure 3:
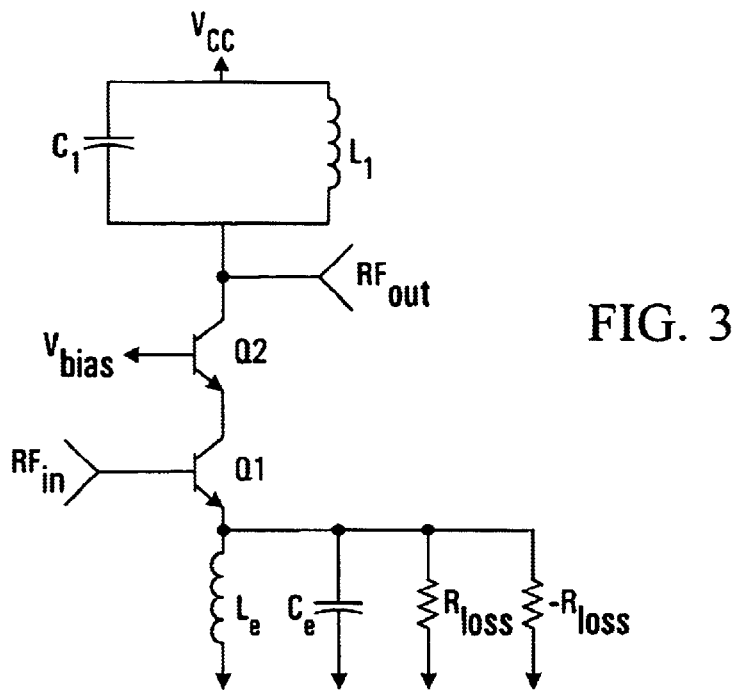
FIG. 3 depicts a modified low-noise amplifier (LNA) topology that offers monolithic image rejection according to the present invention.

The present invention introduces a novel topology comprising a notch filter, centered at the unwanted image frequency, integrated with a traditional LNA. Such a topology may, for example, provide for the fabrication of a fully monolithic superheterodyne receiver front-end. The fundamental idea on which the present invention is based is shown in FIG. 3, where the conventional topology for the cascode LNA of FIG. 2 is modified by replacing the degeneration inductor $L_e$ with an LC resonator. The remainder of the circuitry in FIG. 3 is essentially identical to that depicted in FIG. 2. Like component labels are, therefore, used to denote like components. For simplicity, biasing details have also been omitted.

The LC resonator at the emitter of the driving amplifier Q1 comprises an inductor $L_e$ and a capacitor $C_e$, appropriately chosen to be centered at a desired notch frequency i.e. the particular image frequency of concern.

There will also be some losses associated with the LC resonator and this may be modeled by a resistive element $R_{loss}$ as shown in FIG. 3. At the resonant frequency of the LC resonator, a high impedance will be presented to the emitter of the driving transistor Q1. A high impedance here will mean that the driving amplifier transistor Q1 will have a very low gain at the image frequency. Thus, the LNA will reflect the image. Ideally, an infinite impedance at the emitter of a driving amplifier transistor will translate into zero gain at the image frequency.

At frequencies below the resonant frequency of the LC tank at the emitter of Q1, the LC circuit will look inductive and will have an impedance close to that of the actual inductor $L_e$ used in the circuit. In the pass band, therefore, the LNA will still look like an ordinary LNA with inductive degeneration. Inductive degeneration is typically needed to provide good matching and linearity without impacting the noise figure.

The circuit topology presented in FIG. 3 only illustrates the invention from a conceptual standpoint. From a practical standpoint, the resistance losses $R_{loss}$ associated with the LC resonator will seriously impact its effectiveness. Therefore, in order to overcome the resistive losses $R_{loss}$ of the resonator, some form of active circuitry is needed in addition to the parallel combination of the capacitor $C_e$ and inductor $L_e$. In FIG. 3, a negative resistive element $-R_{loss}$ has been included to indicate the cancellation of resonator losses $R_{loss}$ by appropriate active circuitry. As will be shown, a simple way to implement such cancellation of resonator losses is to add feedback around two series capacitors.

Figure 4:
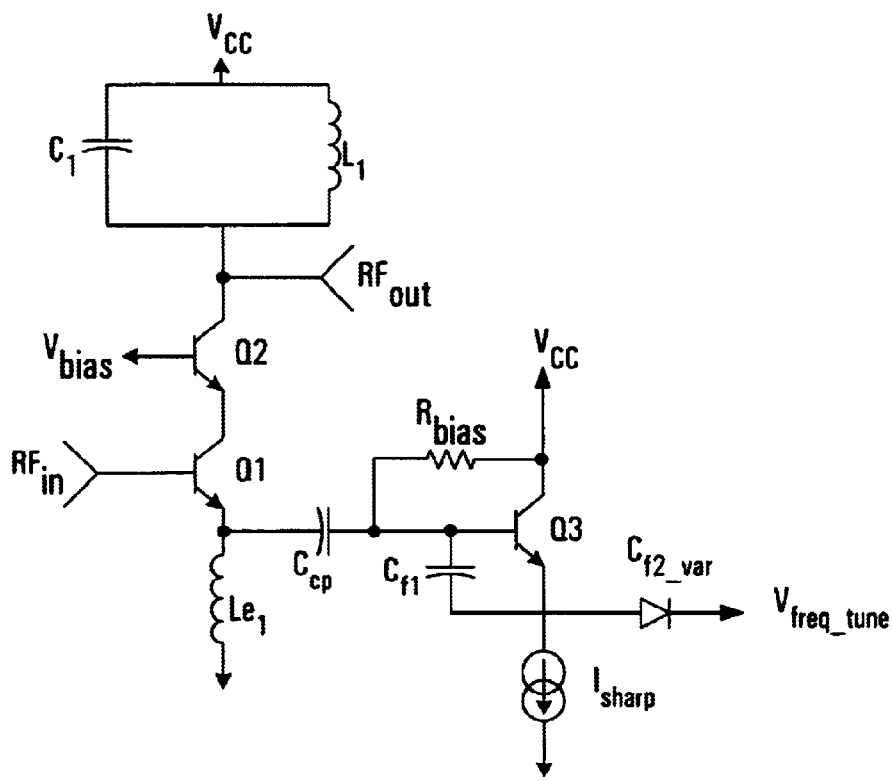
FIG. 4 illustrates a modified low-noise amplifier (LNA) circuit providing monolithic image rejection according to one embodiment of the present invention.

Accordingly, FIG. 4 depicts a complete LNA circuit topology providing monolithic image rejection according to the present invention. Basically, this circuit represents a 'combination' notch filter and amplification stage. The amplification stage is identical to that in FIGS. 2 and 3 and includes a common-emitter (CE) amplifier Q1 driving an npn cascode transistor Q2. Similarly, a first inductor $L_1$ and a first capacitor $C_1$ are arranged in parallel to form an LC resonant tank at the collector of the npn cascode transistor Q2. The emitter of the driving CE amplifier Q1 is grounded via an emitter degeneration inductor $L_{e1}$.

In the circuit of FIG. 4, the emitter of the driving CE amplifier Q1 is further coupled to some additional circuitry comprising a parallel resonator circuit to implement a notch filtering function. Specifically, the emitter of the driving amplifier Q1 is AC coupled via a coupling capacitor $C_{cp}$ to the base of an npn emitter-follower transistor Q3, whose emitter is loaded with a varactor $C_{f2\_var}$, the capacitance of which may be varied by application of a DC bias voltage $V_{freq\_tune}$. The collector of the emitter-follower transistor Q3 is tied to a first power rail or supply voltage $V_{cc}$. The collector of the emitter-follower transistor Q3 is also coupled to its respective base via a bias resistor $R_{bias}$. The emitter-follower transistor Q3 is further connected to a current source $I_{sharp}$ at its emitter while a capacitor $C_{f1}$ is connected across its base-emitter junction. It will be apparent to those skilled in the art that the added circuitry of FIG. 4 may be effectively viewed as one half of a conventional common-collector Colpitts oscillator. This portion of circuitry, however, is not unstable as it will not have enough gain to start oscillating.

Considering the amplification stage of FIG. 4, a cascode transistor configuration is used to eliminate the Miller effect, the dominant contributor to high frequency roll-off. The cascode transistor Q2 is interposed in the collector path of the driving CE amplifier Q1 to prevent its collector from swinging (thereby eliminating the Miller effect) while passing the collector current through unchanged. A fixed DC bias voltage $V_{bias}$ is applied to the base of the cascode transistor Q2 (i.e. the base is assumed to be perfectly AC grounded) and is usually set a few volts above the emitter voltage of the driving CE amplifier Q1 to pin the collector of the driving CE amplifier Q1 and keep it in the active region. Essentially, the cascode transistor Q2 is used to reduce the interaction of the tuned output $RF_{out}$ with the tuned input $RF_{in}$.

LC resonant tank circuits, such as the one used in FIG. 4 comprising the inductor $L_1$ and the capacitor $C_1$, are used extensively in communications circuits to provide selective amplification of a signal at a desired frequency. The components $L_1$ and $C_1$ are selected to resonate at the particular frequency which provides the desired passband response. The inductor $L_1$ or capacitor $C_1$ could also be made variable to enable tuning of the resonant frequency.

Using a tuned LC circuit as a collector load also provides several other advantages: higher single-stage gain, since the load presents a high impedance at the desired signal frequency while still allowing arbitrary quiescent current; elimination of undesirable loading effects of capacitance since the LC resonant circuit tunes out any capacitance by making it part of the tuned circuit capacitance; and elimination of outof-band signals and noise owing to the frequency selectivity of the tuned circuit.

Finally, the emitter degeneration inductor $L_{e1}$ provides the feedback necessary to improve linearity while minimizing noise figure. The inductor $L_{e1}$ should be sized precisely to provide simultaneous noise and power matching and to minimize noise figure. At the same time, the inductor $L_{e1}$ should be sufficiently large enough to ensure acceptable linearity and stability.

In the topology presented in FIG. 4, the filtering function for removing the image frequency is implemented by resonant circuitry placed around the degeneration inductor $L_{e1}$ to make it resonate at the image frequency. To prevent the interaction of DC currents between the adjacent stages (i.e. amplification and filtering stages), the coupling capacitor $C_{cp}$ is used. (capacitors are open circuits at DC and, if large enough, are short circuits over amplifier operating frequencies). Therefore, the coupling capacitor $C_{cp}$ allows a DC level shift between the driving amplifier Q1 and the emitter-follower transistor Q3 of the filtering network.

The transistor Q3 is connected in common-collector configuration and forms an active feedback circuit that cancels any losses in the resonator, therefore making it a perfect open circuit at the resonant frequency. The bias resistor $R_{bias}$ simply provides a bias voltage to the base of the transistor Q3 so that it can turn on and be active. The capacitors $C_{f1}, C_{f2\_var}$ and the inductor $L_{e1}$ set the frequency of the notch. The capacitor $C_{f2\_var}$ is implemented using a tunable capacitance (varactor) to make the filter tunable and to overcome variations in device parameters introduced by unintended variations in the fabrication process. The current source $I_{sharp}$ sets the current flowing through the transistor Q3. Due to process variations, the current source $I_{sharp}$ may need to be tuned to ensure perfect cancellation of the losses in the resonator. This is an essential function because the $-R_{loss}$ of FIG. 3 is proportional to the current $I_{sharp}$. The current source $I_{sharp}$ is, therefore, tuned so that $-R_{loss}=R_{loss}$ or so that the net resistance is zero.

It is important to note here that any capacitance placed in the emitter of the driving amplifier Q1 can result in negative resistance at the base which can lead to instability in the circuit. This is, in fact, why capacitive degeneration is not widely used in the art. In the topology of the present invention, however, the frequency range over which the emitter of the driving amplifier Q1 will have a significant negative reactance is fairly limited, hindering its ability to oscillate.

The resonant circuitry of FIG. 4 eliminates the "stacking" of transistors in order that the lowest possible supply voltage $V_{cc}$ may be used. At the resonant frequency, the active feedback circuit will approximate a perfect open circuit and, therefore, have an infinite impedance. With an infinite amount of degeneration, or resistance in the emitter of the driving amplifier Q1, the amplification stage will have no gain. As a result, there will be a "notch" in the frequency response of the amplifier at this frequency. Accordingly, the notch frequency is tuned to be centered at the frequency of the undesired image.

As mentioned, the varactor $C_{f2\_var}$ effectively controls the tuning range. Thus, the frequency of the notch can be centered by adjusting the varactor capacitance $C_{f2\_var}$ with the DC bias voltage $V_{freq\_tune}$. Furthermore, the notch depth may be controlled by adjusting the current $I_{sharp}$, commonly referred to as "Q-tuning". When the current $I_{sharp}$ is adjusted for "Q tuning", this will also change the emitter-base capacitance of the transistor Q3, in principle affecting the resonant frequency. The capacitor $C_{f1}$ connected across the baseremitter junction of the transistor Q3 decouples the Q-tuning from the frequency tuning i.e. the notch frequency is practically unchanged when the Q1 tuning is performed. The capacitor $C_{f1}$ also improves the linearity of the notch circuit by reducing the amount of voltage across the base-emitter junction of the transistor Q3.

In the specific embodiment of FIG. 4, the resonator circuit with negative feedback at the emitter of the driving amplifier Q1 is implemented with the transistor Q3 connected in a common-collector configuration. However, it should be noted that this is just one possible implementation out of many. Those skilled in the art will appreciate that a resonator with negative feedback may be implemented in a variety of other ways including, but not limited to, common-base and common-emitter versions of the particular circuit shown. Similarly, with respect to MOSFET technology, common-gate or common-source configurations are just as valid.

To illustrate typical component values which may be used to implement an integrated "LNA-image filter" topology according to FIG. 4, consider a conventional receiver front-end requiring a 5 GHz pass band with a 1 GHz IF. This leads to an image frequency at 7 GHz. With respect to the amplification circuit, transistors Q1 and Q2 should be large-size devices on the order of 2×20 µm emitter (i.e. two emitter fingers each with a length of 20 µm). To achieve the desired pass band response, the inductor $L_1$ of the LC tank should be approximately 0.9 nH and the capacitor $C_1$ approximately 750 fF. To provide the feedback necessary to ensure stability and improve linearity while minimizing noise figure, a 0.4 nH on-chip degeneration inductor $L_{e1}$ can be used. The coupling capacitor $C_{cp}$ should be fairly large, at 15 pF for example. The capacitor $C_{f1}$ should be approximately 2 pF, the bias resistor $R_{bias}$ approximately 5 kΩ, and the varactor $C_{f2\_var}$ on the order of 1.5 pF. Lastly, the transistor Q3 forming the active feedback circuit should also be a large-size device comparable to the size of the transistors Q1, Q2 comprising the amplification stage i.e. approximately 2×20 µm.

The sizing of the transistors Q1 and Q2 and the inductor $L_{e1}$ comprising the LNA portion of the circuit should satisfy simultaneous noise and power matching requirements. However, the value of the degeneration inductor $L_{e1}$ should be slightly reduced to compensate for the fact that the presence of the resonator will raise it slightly from its nominal value in the pass band of the circuit. The resistor $R_{bias}$ provides bias to transistor Q3 and its value is not a critical design parameter. The coupling capacitor $C_{cp}$ should be made as large as practically possible so that its presence does not impede the ability of the circuit to overcome its losses although not so large that its parasitic component causes large signal loss. The transistor Q3 should generally be made very large in order that its parasitic resistance does not create additional losses to be overcome.

LNAs have traditionally provided good noise figure and good linearity due to the arrangement of transistors in the signal path. Filters, however, are usually quite complicated and the arrangements of transistors and other circuit elements does not usually lead to good performance. However, in the present invention, the resonator will look inductive below its resonant frequency and will, therefore, have an impedance close to that of the actual inductor Le1 placed in the circuit. Therefore, the topology of the present invention looks just like a traditional LNA with inductive degeneration in the desired pass band.

Those skilled in the art will appreciate that the topology of the present invention is not limited to the bipolar technology shown in the specific embodiments, but may alternatively be implemented using CMOS technology, MESFETs, JFETs, vacuum tubes etc. It is a well known fact that RF circuits may be implemented using any available technology that provides voltage-controlled or current-controlled current sources. For example, the circuit of the present invention would still function if all the bipolar transistors were replaced with corresponding CMOS transistors. Of course, the CMOS transistors would have to be sized appropriately to yield good performance. Therefore optimization of the circuit would be conducted as for the bipolar implementation described in the specific embodiments.

It will be apparent to those skilled in the art that the ground connections in FIG. 4 may alternatively be replaced by connections to a second power rail. For example, a negative power rail or supply voltage, $-V_{EE}$, may be substituted for ground as long as the voltage difference between the two power rails is kept sufficiently small.

Furthermore, in the implementation of FIG. 4, the coupling capacitor $C_{cp}$ is used to AC couple the filtering network to the emitter of the driving amplifier Q1. However, such AC coupling means is not in any way limited to the use of a capacitor. For example, the coupling capacitor $C_{cp}$ may be substituted for by a transformer, or any other element that provides a DC open circuit and an AC short circuit.

Finally, those skilled in the art will appreciate that the concept of the invention is not in any way limited to the LNA application described but may be applied to any multi-terminal circuit element that supplies a signal at its output containing an unwanted image frequency component. For example, the notch filtering network may alternatively be AC coupled to a mixer or buffer amplifier.

While preferred embodiments of the invention have been described and illustrated, it will be apparent to one skilled in the art that numerous modifications, variations and adaptations may be made without departing from the scope of the invention as defined in the claims appended hereto.

What is claimed is:

1. An integrated circuit comprising an image reject filter integrated monolithically with a low-noise amplifier (LNA) to reject an unwanted image frequency component of an input signal, the integrated circuit comprising:
   a driving amplifier having a first conducting terminal for providing an output signal, a second conducting terminal connected to an inductive degeneration element and a control terminal for receiving the input signal;
   a first resonant network coupled to the first conducting terminal of the driving amplifier for causing the driving amplifier to have a substantially high gain at a desired frequency of the input signal; and
   a filtering network coupled to the second conducting terminal of the driving amplifier for providing a substantially high impedance to the second conducting terminal at the image frequency so as to cause the driving amplifier to have a substantially low gain at the image frequency;
   wherein the filtering network comprises a tunable parallel LC resonator and a negative resistance generation network, whereby in operation the negative resistance generation network produces a negative resistance that substantially cancels inherent resistive losses of the LC resonator.

2. An integrated circuit according to claim 1 wherein the driving amplifier is a voltage-controlled current source.

3. An integrated circuit according to claim 1 wherein the driving amplifier is a current-controlled current source.

4. An integrated circuit according to claim 1 wherein the driving amplifier is a transistor.

5. An integrated circuit according to claim 4 wherein the transistor is a bipolar npn transistor having a collector terminal corresponding to the first conducting terminal, an emitter terminal corresponding to the second conducting terminal and a base terminal corresponding to the control terminal.

6. An integrated circuit according to claim 1 wherein the filtering network is coupled to the second conducting terminal of the driving amplifier by means of a transformer.

7. An integrated circuit according to claim 1 wherein the filtering network is coupled to the second conducting terminal of the driving amplifier by means of a coupling capacitor.

8. An integrated circuit according to claim 1 wherein the filtering network comprises a transistor having a first conducting terminal coupled to a first power rail, a second conducting terminal coupled to a current source and a control terminal coupled to the second conducting terminal of the driving amplifier, a feedback capacitor connected across the control and second conducting terminals, a bias resistor connected across the first conducting and control terminals and a varactor whose anode is connected to the second conducting terminal of the transistor and whose cathode is connected to an adjustable tuning voltage.

9. An integrated circuit according to claim 1 wherein a cascode transistor is interposed in the path between the driving amplifier and the first resonant network.

10. An integrated circuit according to claim 1 wherein the first resonant network comprises an inductor and a capacitor connected in a parallel combination, a first junction between the inductor and capacitor connected to a first power rail and a second junction between the inductor and capacitor connected to the first conducting terminal of the driving amplifier.

11. An integrated circuit comprising:
   a multi-terminal circuit element having a first conducting terminal for providing an output signal, a second conducting terminal connected to an inductive degeneration element and a control terminal for receiving an input signal; and
   a filtering network integrated monolithically with the multi-terminal circuit element and coupled to its second conducting terminal for providing a substantially high impedance to the second conducting terminal at an image frequency of the input signal so as to cause an unwanted image frequency component to be substantially eliminated in the output signal of the multi-terminal circuit element;

wherein the filtering network comprises a tunable parallel LC resonator and a negative resistance generation network, whereby in operation the negative resistance generation network produces a negative resistance that substantially cancels inherent resistive losses of the LC resonator.

12. An integrated circuit according to claim 11 wherein the multi-terminal circuit element is a mixer.

13. An integrated circuit according to claim 11 wherein the multi-terminal circuit element is a low-noise amplifier.

* * * * *